(12) United States Patent
Kang et al.

(10) Patent No.: US 8,120,988 B2
(45) Date of Patent: Feb. 21, 2012

(54) DELAY LOCKED LOOP CIRCUIT FOR PREVENTING FAILURE OF COARSE LOCKING

(75) Inventors: Kyoung-Tae Kang, Seoul (KR); In-Dal Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 147 days.

(21) Appl. No.: 12/659,057

(22) Filed: Feb. 24, 2010

(65) Prior Publication Data

US 2010/0214858 A1    Aug. 26, 2010

(30) Foreign Application Priority Data

Feb. 25, 2009    (KR) .................. 10-2009-0016008

(51) Int. Cl.
*G11C 8/18* (2006.01)

(52) U.S. Cl. .............. 365/233.12; 365/233.19; 365/194; 365/193; 327/149; 327/147; 327/158

(58) Field of Classification Search .................. 365/194, 365/193, 191, 233.12, 233.13, 233.19, 233.1; 327/158, 159, 156, 149, 147
See application file for complete search history.

(56) References Cited

U.S. PATENT DOCUMENTS 7,872,508 B2 *    1/2011    Ku et al. .................. 327/158
2010/0214858 A1 *    8/2010    Kang et al. .................. 365/193

FOREIGN PATENT DOCUMENTS

JP         2001-028538         1/2001

* cited by examiner

*Primary Examiner* — Andrew Q Tran
(74) *Attorney, Agent, or Firm* — Harness, Dickey & Pierce, P.L.C.

(57) ABSTRACT

A delay locked loop circuit includes a delay locked loop receiving an external clock, a frequency detector delaying an input frequency signal to generate a plurality of strobe signals and outputting a check signal indicating that the frequency of the input frequency signal is equal to or lower than a reference frequency when all of the strobe signals are positioned within a first-status section of one cycle of the input frequency signal, a delay lock reset unit generating a reset signal to reset the frequency detector and an activation signal to enable the delay locked loop to perform a delay lock process, and a direct phase detector controlling a coarse locking window on the basis of the check signal and generating a pair of phase detection signals indicating logic levels of the external clock. According to this configuration, since the coarse locking window is controlled as per a frequency band, it is possible to prevent a failure of a coarse locking and to achieve an improved circuit performance.

20 Claims, 7 Drawing Sheets

DELAY LOCKED LOOP CIRCUIT FOR PREVENTING FAILURE OF COARSE LOCKING

CROSS-REFERENCE TO RELATED APPLICATIONS

This application claims priority under 35 U.S.C. §119 to Korean Patent Application No. 2009-0016008, filed on Feb. 25, 2009, in the Korean Intellectual Property Office (KIPO), the entire contents of which are incorporated herein by reference.

BACKGROUND

1. Field

Example embodiments of the present invention relate generally to a delay locked loop circuit, and in particular, a delay locked loop circuit capable of preventing or minimizing a failure of a coarse locking during a locking operation of a delay locked loop.

2. Related Art

There is a movement towards developing dynamic random access memories (hereinafter, referred to as 'DRAM'), generally adapted as main memories of electronic systems, with a high degree of integration and high speed.

DRAMs are volatile memories which include memory cells as units, are readable and writable, and require being refreshed. Each of the memory cells includes one access transistor and one storage capacitor.

Improved high-speed, high-performance DRAMs include SDRAMs, DDR SDRAMs, FCRAMs, etc. In case of SRAM, writing or reading data is possible only at either rising or falling edges of a clock. In case of DDR SDRAM, writing or reading data is possible at falling edges as well as rising edges. Therefore, the data transmission speed of DDR SDRAM is twice that of SDRAM.

For example, if a memory system operates at 400 MHz and transmits data at all rising and falling edges of a clock, the effective data transmission speed per pin is 800 Mb/s. At this time, the bit time for data is 1.25 ns, which is very short. In order to meet these strict timing requirements, an interface circuit requires a circuit for synchronizing the phase of an internal on-chip clock with the phase of an external system clock. If an external clock may be internally used, internal circuits may cause clock skew. A delay locked loop (hereinafter, referred to as 'DLL') is used to synchronize the phase of an internal clock with the phase of the external clock, thereby compensating such clock skew.

A general delay locked loop for high-performance DRAM delays and locks an external clock, thereby generating an internal clock in sync with the external clock. The internal clock may be used as a timing control signal to output data.

Frequency ranges which DLLs cover have been extended from a low frequency of 250 MHz to a high frequency of 1 GHz with an increase in operation frequencies of electronic systems or semiconductor memory devices adapted in electronic systems.

In case of a DLL circuit having an additional coarse locking function for increasing the operation speed of a DLL, a failure of a coarse locking may occur in a low-frequency inversion locking operation.

In a coarse locking operation of a DLL, if a coarse locking window is not adjusted to correspond to a frequency band, a failure of a coarse locking may occur in a frequency band of the DLL.

For these reasons, there is a need for an improved DLL circuit capable of preventing or minimizing a failure of a coarse locking during a locking operation of a DLL.

SUMMARY

Example embodiments relate to a delay locked loop (DLL) circuit capable of preventing or minimizing a failure of a coarse locking during a locking operation of a DLL.

Example embodiments relate to a semiconductor memory device having a DLL circuit in which a coarse locking window is appropriately adjusted to correspond to a frequency band.

Example embodiments relate to a DLL circuit preventing a failure of a coarse locking and having an improved performance, and a semiconductor memory device having the same.

In one example embodiment, a delay locked loop circuit may include a delay locked loop configured to receive an external signal and perform a delay lock process, a frequency detector configured to delay an input frequency signal which is obtained by delaying the external signal to generate a plurality of strobe signals and output a check signal indicating whether the frequency of the input frequency signal is equal to or lower than a predetermined or reference frequency if all of the strobe signals are positioned within a first-status section of one cycle of the input frequency signal, and a direct phase detector configured to receive the check signal from the frequency detector, control a coarse locking window of the delay locked loop circuit on the basis of the check signal, and generate a pair of phase detection signals indicating logic levels of the external signal.

In at least one example embodiment, the delay locked loop circuit may include a delay lock reset unit configured to generate a reset signal to reset the frequency detector and an activation signal to enable the delay locked loop to perform the delay lock process, and output the reset signal and the activation signal to the frequency detector and the delay locked loop, respectively.

In this example embodiment, the delay lock reset unit may include a counter for setting a frequency detection time period which is required for the frequency detector to detect the frequency of the input frequency signal.

The number of the strobe signals may be 3, and the first-status section of the input frequency signal may be a high-level section.

A time interval between first and second strobe signals of the three strobe signals may indicate the predetermined or reference frequency and a time interval between the second strobe signal and a third strobe signal of the three strobe signals may indicate a marginal delay time interval based on a distortion in a duty cycle of the input frequency signal.

The direct phase detector may be configured to pass the input frequency signal through a delay path to generate a later phase detection signal of the pair of phase detection signals when the check signal indicates that the frequency of the input frequency signal is equal to or lower than the predetermined or reference frequency.

In another example embodiment, a semiconductor memory device may include a memory cell array having a plurality of memory cells, a read/write circuit connected to the plurality of memory cells, and a delay locked loop circuit. The delay locked loop circuit may include a delay locked loop configured to delay an external clock to generate an internal clock, and apply the internal clock to the read/write circuit, a frequency detector configured to delay an input frequency signal which is obtained by delaying the external clock to generate a plurality of strobe signals and output a check signal indicating whether the frequency of the input frequency signal is equal to or lower than a predetermined or reference frequency when all of the strobe signals are positioned within a first-status section of one cycle of the input frequency signal, a delay lock reset unit configured to generate a reset signal to reset the frequency detector and an activation signal to enable the delay locked loop to perform a delay lock process, and output the reset signal and the activation signal to the frequency detector and the delay locked loop, respectively, and a direct phase detector configured to receive the check signal from the frequency detector, control a coarse locking window of the delay locked loop circuit on the basis of the check signal, and generate a pair of phase detection signals indicating logic levels of the external clock.

In this example embodiment, the number of the strobe signals may be 3, and the first-status section of the input frequency signal may be a high-level section.

A time interval between first and second strobe signals of the three strobe signals indicates the predetermined or reference frequency and a time interval between the second strobe signal and a third strobe signal of the three strobe signals indicates a marginal delay time interval based on a distortion in a duty cycle of the input frequency signal.

According to example embodiments of the invention, since the coarse locking window is controlled based on a desired frequency band, it is possible to prevent a failure of a coarse locking and to achieve an improved circuit performance, in a frequency band of the DLL.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A general frequency inversion locking operation will be described briefly with reference to FIGS. 1 and 2 in order to provide an understanding of example embodiments of the present invention.

Figure 1:
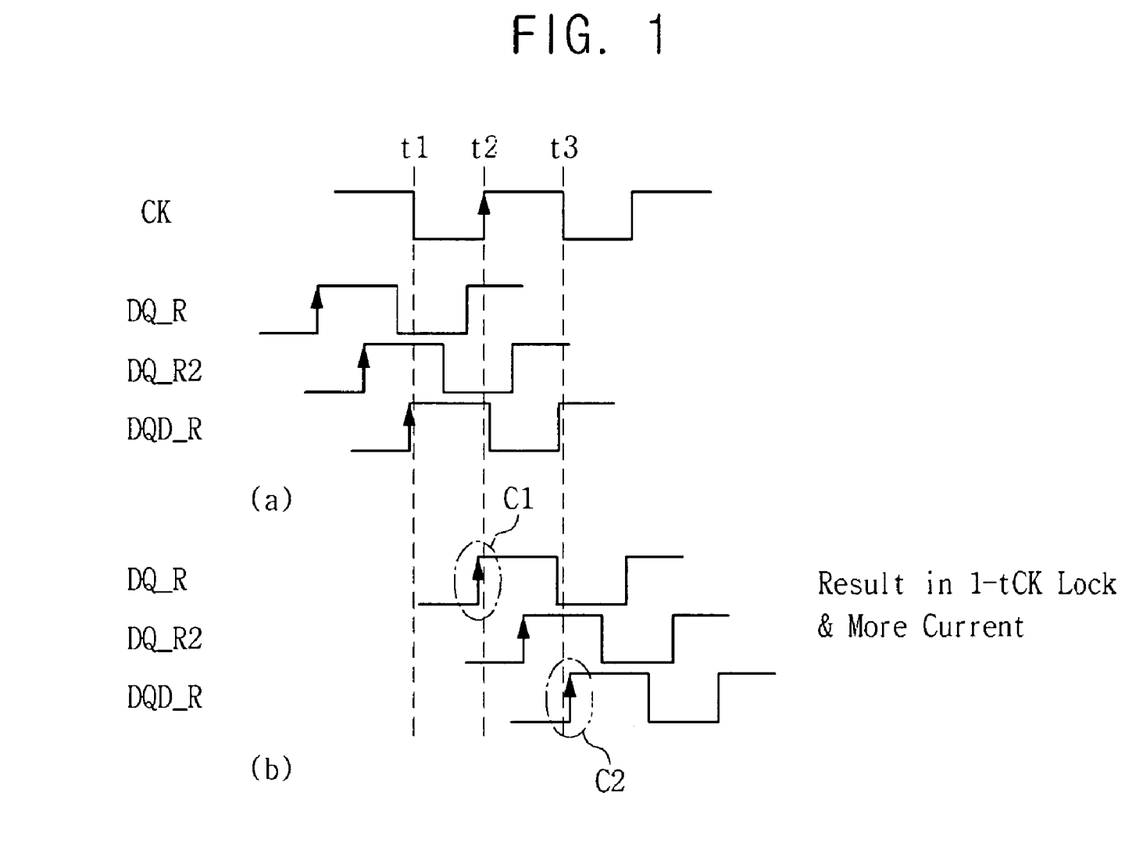
FIG. 1 is a timing chart illustrating an operation of setting a coarse locking window in a general delay locked loop (DLL)
Figure 2:
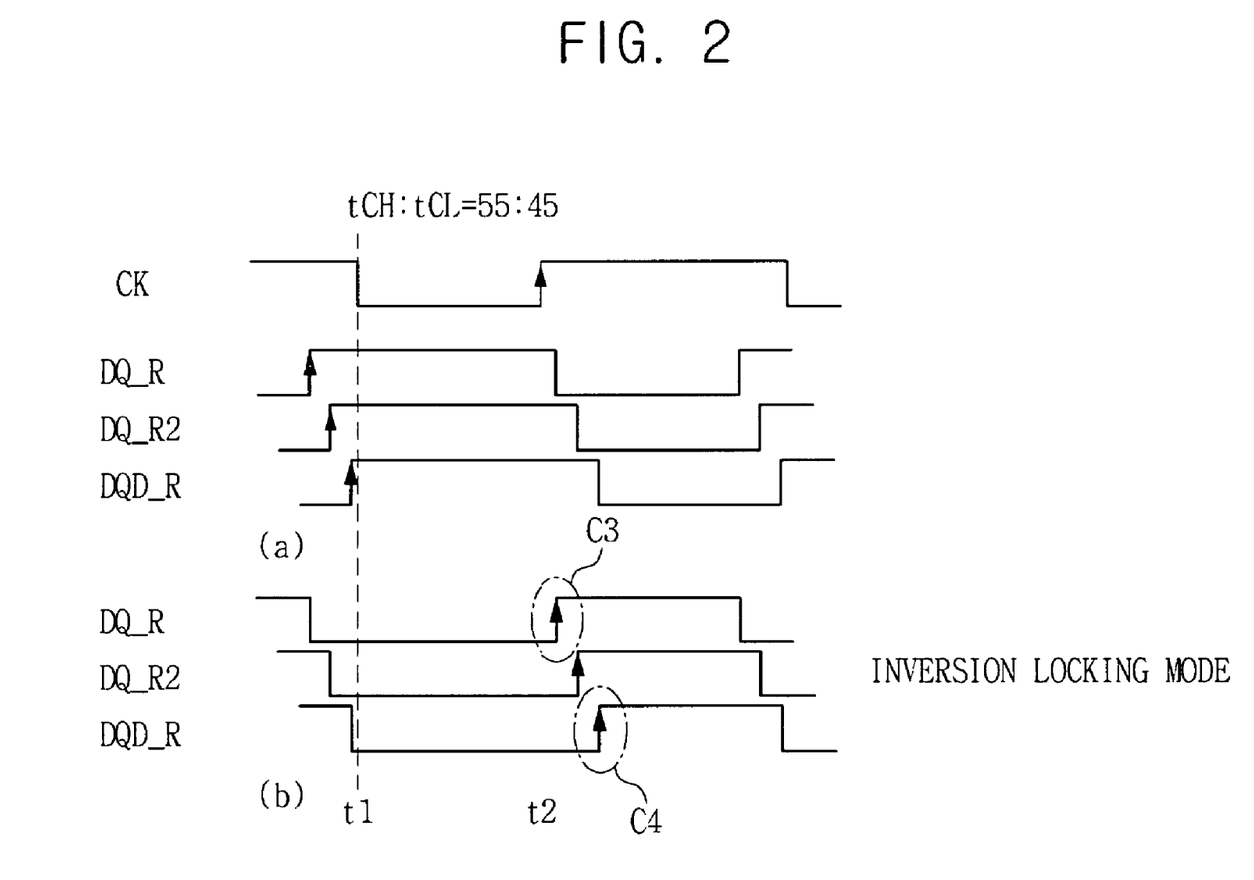
FIG. 2 is a timing chart illustrating a failure of a coarse locking during a low-frequency inversion locking operation.

FIG. 1 is a liming chart illustrating an operation of setting a coarse locking window in a general delay locked loop (DLL), and FIG. 2 is a timing chart illustrating a failure of a coarse locking during a low-frequency inversion locking operation.

With respect to (a) in FIG. 1, CK represents an external clock, DQ_R represents a clock having passed a replica path, and DQD_R represents a clock obtained by delaying the clock DQ_R.

In a coarse locking operation of DLL, a direct phase detector in a DLL circuit transmits phase detection signals PD_F and PD_FD to a DLL control block. The phase detection signals indicate information regarding logic levels of the external clock CK at rising edges of the clocks DQ_R and DQD_R, and are used to determine whether a rising edge of the external clock CK is positioned in a coarse locking window tDelay (DQ_R~DQD_R). That is, the low and high statuses of the external clock CK are detected by the clocks DQ_R and DQD_R, respectively.

Here, the coarse locking window of the direct phase detector is tuned to have a width smaller than 0.5 tck (1 tck is one cycle of the external clock) of a high frequency. As shown in case of (b) in FIG. 1, if the coarse locking window has a width larger than 0.5 tck, even though the clock DQ_R is aligned with an rising edge of the external clock CK (refer to a reference symbol 'C1'), the clock DQD_R is aligned within a low-status section of the external clock CK as shown by a reference symbol 'C2'. Therefore, the direct phase detector of the DLL circuit may fail to successfully transmit coarse locking information.

In this case, the DLL delays the clock DQ_R to perform locking with respect to the next rising edge of the external clock CK. To this end, more delay cells are used.

Then, the detection operation of a high-frequency clock may be degraded and more delay cells may be selected, which results in higher power consumption. In order to prevent this problem, a coarse locking window may be set with reference to a maximum high frequency, resulting in a failure of a coarse locking in a low-frequency inversion locking operation as shown in case of (b) in FIG. 2.

When the high level section of the external clock is wider than the low level section thereof as shown in case of (a) in FIG. 2, if a low-frequency inversion locking operation is performed as shown in case of (b), a failure of a coarse locking may occur. That is, in case of the low-frequency inversion locking operation, inverted clocks DQ_R and DQD_R are positioned later than rising edge time t2 of the external clock CK as shown by reference symbols C3 and C4 of the case (b). In order to perform locking at the next rising edge of the external clock CK, more delay cells may be used. If all of set delay cells are used, a failure of a coarse locking may occur.

As described above, when the coarse locking window is not adjusted to correspond to a frequency band, a failure of a coarse locking may occur in the frequency band of the DLL. For this reason, there is a need for an improved technique capable of preventing or minimizing a failure of a coarse locking.

Figure 3:
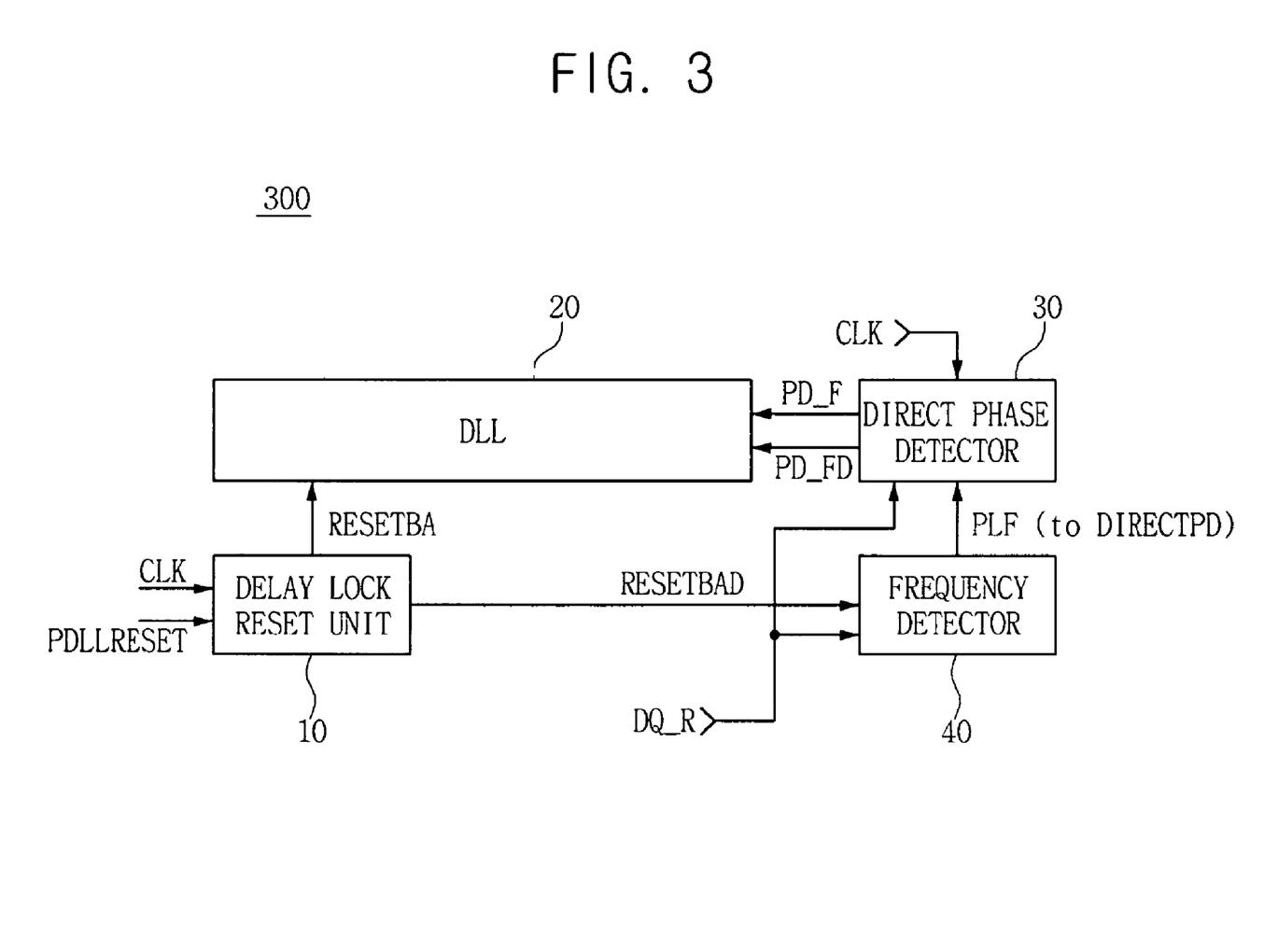
FIG. 3 is a block diagram illustrating a DLL circuit according to an example embodiment of the present invention.

FIG. 3 is a block diagram illustrating a DLL circuit 300 according to an example embodiment of the present invention.

Example embodiments of the present invention include a frequency detector 40 for detecting a frequency band as shown in FIG. 3 to optimize a coarse locking window of a direct phase detector 30 on the basis of frequencies. Referring to FIG. 3, DLL circuit 300 includes a DLL 20, a delay lock reset unit 10, a frequency detector 40, and a direct phase detector 30. The DLL 20 may include a coarse delay unit, a fine delay unit, and a DLL control block although not shown. The DLL control block may determine whether coarse locking has succeeded, on the basis of phase detection signals PD_F and PD_FD, and output a flag indicating whether the coarse locking has succeeded to the coarse delay unit and the first delay unit, thereby a total amount of delay. The delay lock reset unit 10 generates a reset signal RESETBAD to reset the frequency detector and an activation signal RESETBA to enable the DLL 20 to perform a delay lock process, and outputs the reset signal RESETBAD and the activation signal RESETBA to the frequency detector 40 and the DLL 20, respectively. The activation signal RESETBA may be generated when a frequency detection time period elapses after the delay lock reset 10 receives a signal pdllreset. The signal pdllreset is for initialing and activating the DLL circuit. The frequency detector 40 delays an input frequency signal DQ_R to generate a plurality of strobe signals. When all of the plurality of strobe signals are positioned within a first level (for example, high level) section of the input frequency signal DQ_R, the frequency detector 40 may output a check signal PLF at a high level. For example, the frequency detector 40 may output a check signal PLF at a high level if all of the plurality of strobe signals have a rising edges that occur during a high portion of one cycle of the input frequency, or if all of the plurality of strobe signals have a rising edges that occur during a low portion of one cycle of the input frequency signal. The check signal PLF having the high level may indicate that the frequency of the input frequency signal DQ_R is low. On the basis of the check signal PLF from the frequency detector 40, the direct phase detector 30 may generate a pair of phase detection signals PD_F and PD_FD and send the phase detection signals PD_F and PD_FD to the DLL 20. The DLL 20 may adjust the total amount of delay on the basis of the phase detection signals PD_F and PD_FD.

If the frequency detector 40 outputs the check signal PLF at a high level, the coarse locking window of the direct phase detector 30 may automatically extend, thereby preventing a failure of a coarse locking. As described above, the coarse locking window may be controlled based on a frequency band, thereby preventing a failure of a coarse locking and achieving an optimal performance in accordance with the current DLL frequency band.

Figure 4:
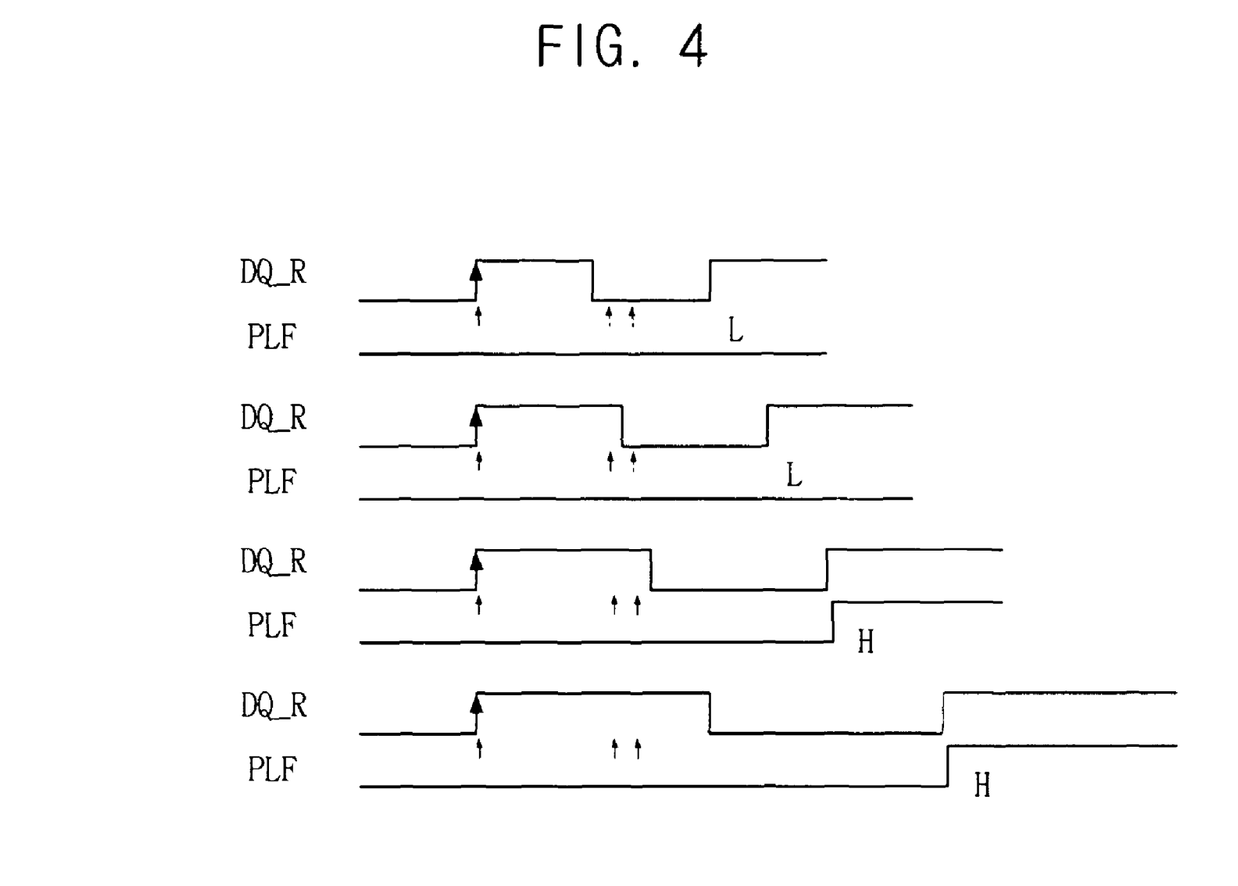
FIG. 4 is a timing chart illustrating an example of the operation of the DLL circuit shown in FIG. 3.
Figure 5:
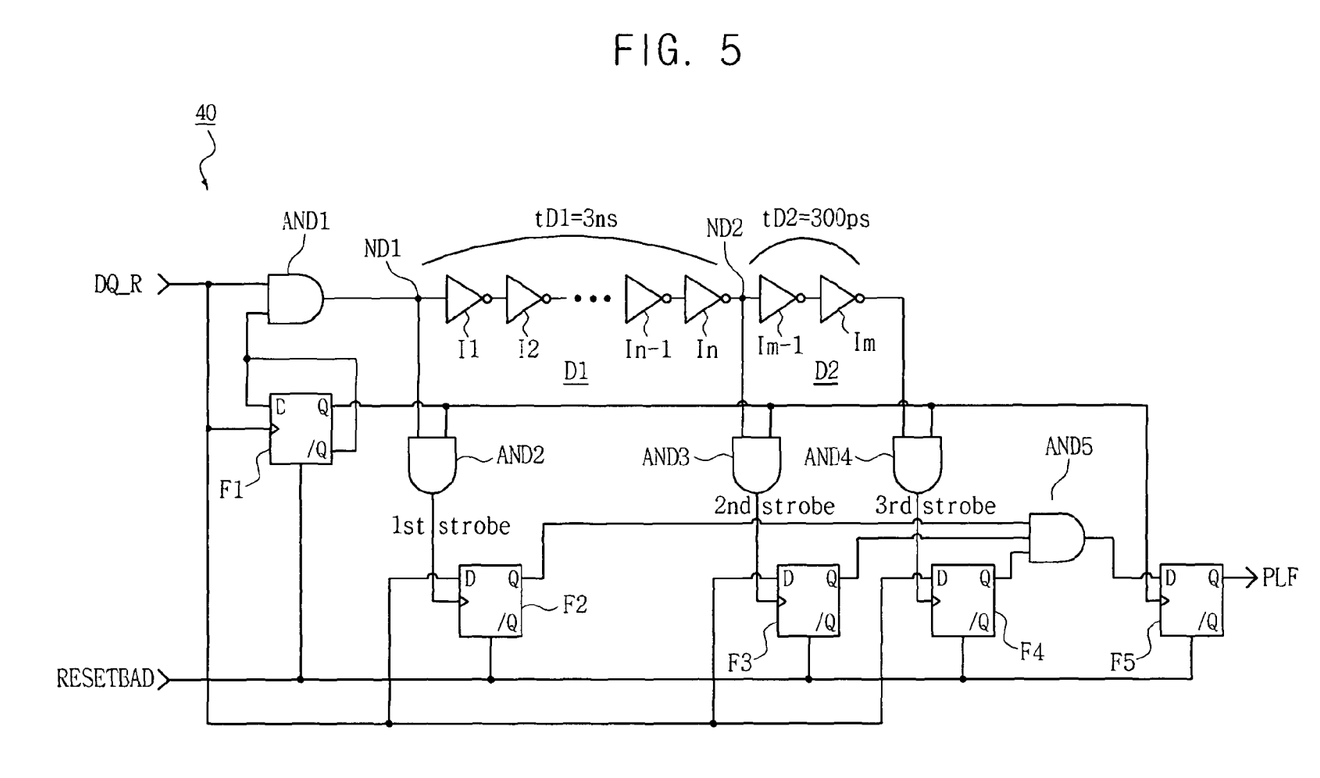
FIG. 5 is a diagram illustrating the detailed configuration of an example of the frequency detector shown in FIG. 3.
Figure 6:
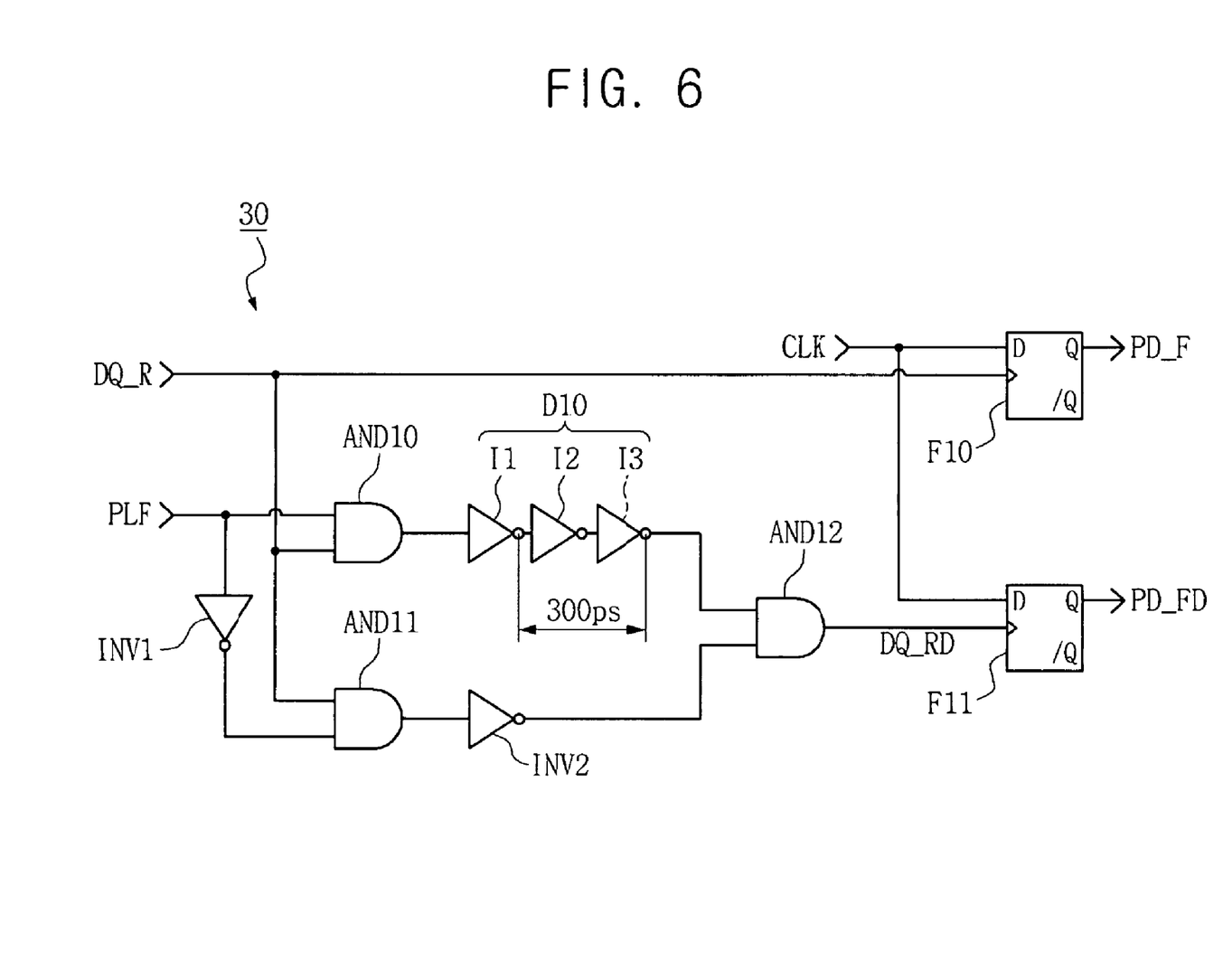
FIG. 6 is a diagram illustrating the detailed configuration of an example of the direct phase detector shown in FIG. 3.

FIG. 4 is a timing chart illustrating an example of the operation of the DLL circuit 300 shown in FIG. 3, FIG. 5 is a diagram illustrating an example of a detailed configuration of the frequency detector 40 shown in FIG. 3, and FIG. 6 is a diagram illustrating an example of a detailed configuration of the direct phase detector 30 shown in FIG. 3.

FIG. 4 shows examples of the input frequency signal DQ_R having different frequencies. Referring to FIG. 4, when the frequency of the input frequency signal DQ_R is equal to or lower than a predetermined or reference frequency, the check signal PLF may have the high level. The check signal PLF having the high level may indicate that all of three strobe signals generated by the frequency detector having a configuration shown in FIG. 5 are positioned within a high level section of one cycle of the input frequency signal DQ_R.

Referring to FIG. 5, the frequency detector 40 may include first to fifth AND gates AND1 to AND5, first to fifth flip-flops F1 to F5, a first delay unit D1 and a second delay unit D2.

The frequency detector 40 having a configuration shown in FIG. 5 may generate three strobe signals (first to third strobe signals) in response to a rising edge of the input frequency signal DQ_R. The delay time interval of the first delay unit D1 is referred to as a first delay time interval and the delay time interval of the second delay unit D2 is referred to as a second delay time interval. The maximum of the first delay time interval may be, for example, 3 ns and the maximum of the second delay time interval may be, for example, 300 ps. Accordingly, the maximum of the time interval between the first strobe signal and the second strobe signal may be 3 ns, and the maximum of the time interval between the second strobe signal and the third strobe signal may be 300 ps. If the first to third strobe signals are positioned within a high level section of one cycle of the input frequency signal DQ_R, the fifth flip-flop F5 may output the check signal PLF at the high level through an output terminal Q thereof. The check signal PLF having the high level indicates that the frequency of the input frequency signal DQ_R is low.

The first delay time interval may indicate the predetermined or reference frequency and the second delay time interval may indicate a marginal delay time interval based on a potential distortion of around 10% in a duty cycle of the input frequency signal DQ_R. The number of delay elements constituting the first delay unit D1 or the second delay unit D2 of FIG. 5 may be determined in accordance with a desired frequency band.

FIG. 6 is a diagram illustrating an example of a detailed configuration of the direct phase detector 30 shown in FIG. 3.

Referring to FIG. 6, the direct phase detector 30 may include first to third AND gates AND10 to AND12, a first flip-flop F10, a second flip-flop F11, an inverter INV1, and a delay unit D10. When receiving the check signal PLF having the high level from the frequency detector 40, the direct phase detector 30 may generate the pair of phase detection signals PD_F and PD_FD to change the coarse locking window.

When the check signal PLF has the high level, the clock DQ_R may pass the delay unit D10. The delay time interval of the delay unit D10 may be 300 ps. Therefore, the phase detection signal PD_FD may be output later than the phase detection signal PD_F by about 300 ps. As a result, the coarse locking window may automatically extend, thereby preventing a failure of a coarse locking.

According to example embodiments of the present invention, when the frequency of the input frequency signal DQ_R is equal to or lower than the predetermined or reference frequency, the clock DQ_R may be delayed to generate the clock DQD_R and the phase detection signals may be generated to extend the coarse locking window.

Therefore, a DLL circuit having a wide locking range can be realized and a failure of a coarse locking can be prevented.

According to example embodiments of the invention, since the coarse locking window is controlled based on a desired frequency band, it is possible to prevent a failure of a coarse locking and to achieve an improved circuit performance.

While example embodiments have been particularly shown and described, it will be understood by one of ordinary skill in the art that variations in form and detail may be made therein without departing from the spirit and scope of the claims. For example, in some cases, the internal connection configuration of the DLL circuit or operation timings may be modified without departing from the technical spirit and scope of the invention.

Figure 7:
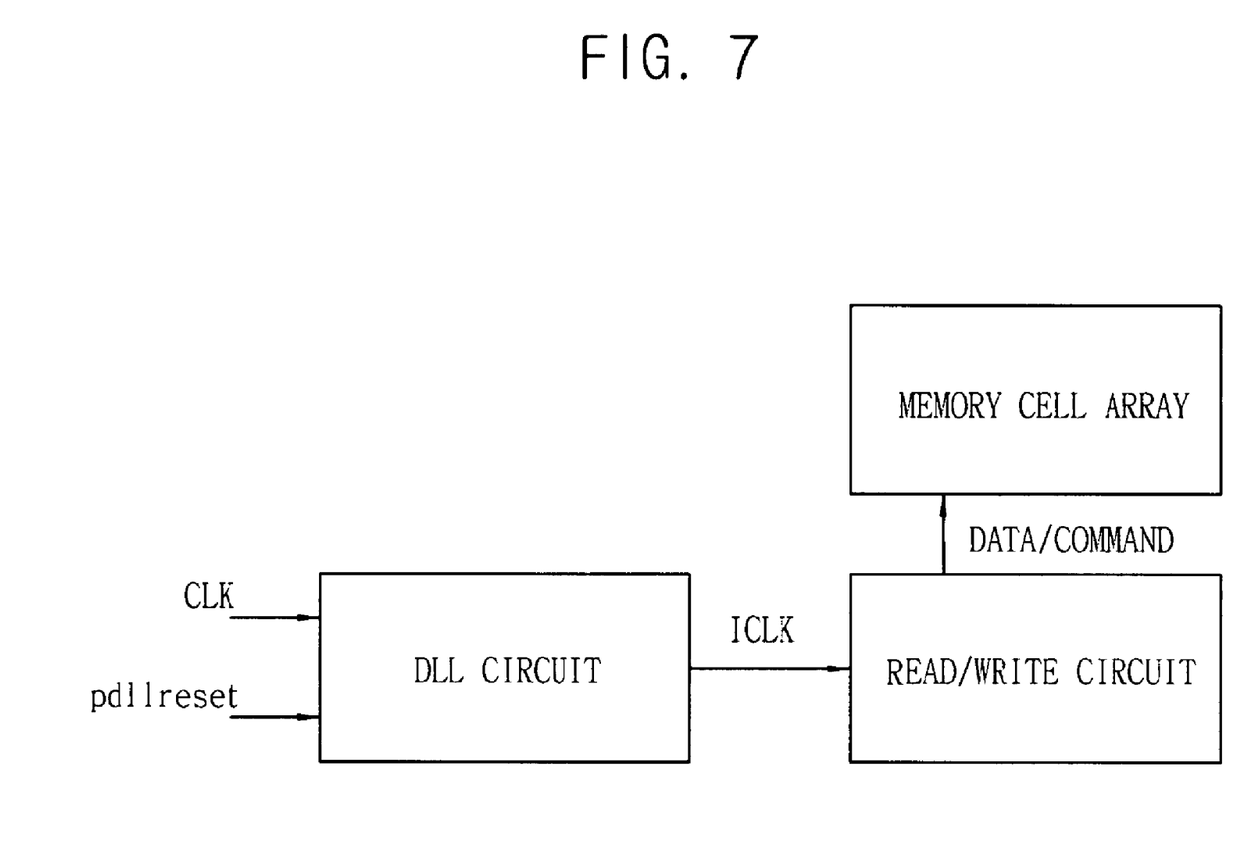
FIG. 7 is a schematic diagram illustrating an example of a configuration of a semiconductor memory device capable of adapting a DLL circuit according to an example embodiment of the present invention.

Example embodiments of the present invention can be applied to volatile memory or semiconductor devices as well as DRAM. An example of a configuration of a semiconductor memory device capable of adapting a DLL circuit according to an example embodiment is schematically shown in FIG. 7.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A delay locked loop circuit comprising:
   a delay locked loop configured to receive an external clock and perform a delay lock process;
   a frequency detector configured to delay an input frequency signal which is obtained by delaying the external clock to generate a plurality of strobe signals, and output a check signal indicating whether the frequency of the input frequency signal is equal to or lower than a reference frequency if all of the strobe signals are positioned within a first-status section of one cycle of the input frequency signal; and
   a direct phase detector configured to receive the check signal from the frequency detector, control a coarse locking window of the delay locked loop circuit on the basis of the check signal, and generate a pair of phase detection signals indicating logic levels of the external clock.

2. The delay locked loop circuit of claim 1, further comprising:
   a delay lock reset unit configured to generate a reset signal to reset the frequency detector and an activation signal to enable the delay locked loop to perform the delay lock process, and output the reset signal and the activation signal to the frequency detector and the delay locked loop, respectively.

3. The circuit of claim 2, wherein the delay lock reset unit includes a counter configured to set a frequency detection time period which is the maximum time period required for the frequency detector to detect the frequency of the input frequency signal.

4. The circuit of claim 1, wherein a number of the plurality of strobe signals is 3.

5. The circuit of claim 4, wherein a time interval between first and second strobe signals of the three strobe signals indicates the reference frequency and a time interval between the second strobe signal and a third strobe signal of the three strobe signals indicates a marginal delay time interval based on a distortion in a duty cycle of the input frequency signal.

6. The circuit of claim 4, wherein the direct phase detector is configured to pass the input frequency signal through a delay path to generate a later phase detection signal of the pair of phase detection signals when the check signal indicates that the frequency of the input frequency signal is equal to or lower than the reference frequency.

7. The circuit of claim 1, wherein the first-status section of the input frequency signal is a high-level section.

8. A semiconductor memory device comprising:
a memory cell array having a plurality of memory cells;
a read/write circuit connected to the plurality of memory cells;
a delay locked loop circuit including
a delay locked loop configured to delay an external clock to generate an internal clock, and apply the internal clock to the read/write circuit;
a frequency detector configured to delay an input frequency signal which is obtained by delaying the external clock to generate a plurality of strobe signals and output a check signal indicating whether the frequency of the input frequency signal is equal to or lower than a reference frequency if all of the strobe signals are positioned within a first-status section of one cycle of the input frequency signal;
a delay lock reset unit configured to generate a reset signal to reset the frequency detector and an activation signal to enable the delay locked loop to perform a delay lock process, and output the reset signal and the activation signal to the frequency detector and the delay locked loop, respectively; and
a direct phase detector configured to receive the check signal from the frequency detector, control a coarse locking window of the delay locked loop circuit on the basis of the check signal, and generate a pair of phase detection signals indicating logic levels of the external clock.

9. The device of claim 8, wherein a number of the plurality of strobe signals is 3.

10. The device of claim 9, wherein the first-status section of the input frequency signal is a high-level section.

11. The device of claim 10, wherein a time interval between first and second strobe signals of the three strobe signals indicates the reference frequency and a time interval between the second strobe signal and a third strobe signal of the three strobe signals indicates a marginal delay time interval based on a distortion in a duty cycle of the input frequency signal.

12. A delay locked loop circuit comprising:
a delay locked loop configured to receive an external clock and perform a delay lock process;
a frequency detector configured to generate a plurality of strobe signals by delaying an input frequency signal which is a delayed signal of the external clock, the frequency detector being configured to output a check signal indicating a frequency of the input frequency signal based on one or more of the plurality of strobe signals; and a direct phase detector configured to control a coarse locking window of the delay locked loop circuit on the basis of the check signal, and generate a pair of phase detection signals indicating logic levels of the external clock.

13. The delay lock loop circuit of claim 12, further comprising:
a delay lock reset unit configured to generate a reset signal to reset the frequency detector and an activation signal to enable the delay locked loop to perform the delay lock process, and output the reset signal and the activation signal to the frequency detector and the delay locked loop, respectively.

14. The circuit of claim 13, wherein the delay lock reset unit includes a counter configured to set a frequency detection time period which is the minimum time period required for the frequency detector to detect the frequency of the input frequency signal.

15. The delay locked loop circuit of claim 12, wherein the frequency detector is configured to output the check signal if all of the plurality of strobe signals have rising edges that occur during a high portion of one cycle of the input frequency signal, or if all of the plurality of strobe signals have rising edges that occur during a low portion of one cycle of the input frequency signal.

16. The delay locked loop circuit of claim 12, wherein the direct phase detector is configured to receive the check signal from the frequency detector.

17. The circuit of claim 12, wherein the check signal indicates that the frequency of the input frequency signal is equal to or lower than a reference frequency based on the one or more of the plurality of strobe signals.

18. The circuit of claim 17, wherein a number of the plurality of strobe signals is 3.

19. The circuit of claim 18, wherein the frequency detector includes
a first delay unit configured to control a first time interval between first and second strobe signals of the three strobe signal, and
a second delay unit configured to control a second time interval between the second strobe signal and a third strobe signal of the three strobe signals,
the first delay unit being configured to control the first time interval to correspond to the reference frequency, and the second delay unit being configured to control the second time interval to correspond to a marginal delay time interval based on a distortion in a duty cycle of the input frequency signal.

20. The circuit of claim 18, wherein the direct phase detector is configured to pass the input frequency signal through a delay path to generate a later phase detection signal of the pair of phase detection signals based on receiving the check signal.

* * * * *